US012596163B2

(12) United States Patent
Ritter

(10) Patent No.: US 12,596,163 B2
(45) Date of Patent: Apr. 7, 2026

(54) MAGNETIC RESONANCE TOMOGRAPHY SYSTEM AND METHOD FOR OPERATING A MAGNETIC RESONANCE TOMOGRAPHY SYSTEM

(71) Applicant: Siemens Healthcare GmbH, Erlangen (DE)

(72) Inventor: Dieter Ritter, Fürth (DE)

(73) Assignee: Siemens Healthineers AG, Erlangen (DE)

( * ) Notice: Subject to any disclaimer, the term of this patent is extended or adjusted under 35 U.S.C. 154(b) by 411 days.

(21) Appl. No.: 18/218,172

(22) Filed: Jul. 5, 2023

(65) Prior Publication Data

US 2024/0012079 A1      Jan. 11, 2024

(30) Foreign Application Priority Data

Jul. 5, 2022    (DE) ..................... 10 2022 206 848.3

(51) Int. Cl.
*G01R 33/56*            (2006.01)

(52) U.S. Cl.
CPC ................................ *G01R 33/5608* (2013.01)

(58) Field of Classification Search
CPC .................................................. G01R 33/5608
See application file for complete search history.

(56) References Cited

U.S. PATENT DOCUMENTS

| | | | | |
|---|---|---|---|---|
| 8,480,404 | B2 * | 7/2013 | Savitsky | G09B 23/286 |
| | | | | 600/416 |
| 11,238,197 | B1 * | 2/2022 | Douglas | G16H 50/20 |

| | | | | |
|---|---|---|---|---|
| 2022/0013231 | A1 * | 1/2022 | Xanthis | G06N 3/0475 |
| 2022/0327948 | A1 | 10/2022 | Konnov et al. | |

FOREIGN PATENT DOCUMENTS

| | | | |
|---|---|---|---|
| WO | 2021052955 | A1 | 3/2021 |
| WO | 2021251884 | A1 | 12/2021 |

OTHER PUBLICATIONS

Quan, T. M. et al: "Compressed Sensing MRI Reconstruction Using a Generative Adversarial Network with a Cyclic Loss," In: IEEE transactions on medical imaging, 2018, 37. Jg., Nr. 6, pp. 1488-1497.
Abadi, E. et al: "Virtual Clinical Trials in Medical Imaging: A Review," In: Journal of Medical Imaging, 2020, 7. Jg., Nr. 4, pp. 042805-1-40.
Benoit-Cattin, H. et al: "The SIMRI Project: A Versatile and Interactive MRI Simulator," In: Journal of Magnetic Resonance, 2005, 173. Jg., Nr. 1, pp. 97-115. doi: 10.1016/j.jmr.2004.09.027.
Cao, Z. et al: "Bloch-Based MRI System Simulator Considering Realistic Electromagnetic Fields for Calculation of Signal, Noise, and Specific Absorption Rate," In: Magnetic resonance in medicine, 2014, 72. Jg., Nr. 1, pp. 237-247.

* cited by examiner

*Primary Examiner* — Gregory H Curran
(74) *Attorney, Agent, or Firm* — Banner & Witcoff, Ltd.

(57) ABSTRACT

The present disclosure relates to a magnetic resonance tomography system in which the field generation unit can be replaced by a digital emulation. Activation signals of a conventional system can be provided to this digital emulation. The digital emulation of the field generation unit outputs output signals that correspond to output signals of a hardware-based field generation unit.

13 Claims, 2 Drawing Sheets

MAGNETIC RESONANCE TOMOGRAPHY SYSTEM AND METHOD FOR OPERATING A MAGNETIC RESONANCE TOMOGRAPHY SYSTEM

CROSS-REFERENCE TO RELATED APPLICATIONS

The present application claims priority to and the benefit of Germany patent application no. DE 10 2022 206 848.3, filed on Jul. 5, 2022, the contents of which are incorporated herein by reference in their entirety.

TECHNICAL FIELD

The disclosure relates to a magnetic resonance imaging system and, in particular, to a magnetic resonance imaging system in which the field generation unit can be replaced by a digital emulation.

BACKGROUND

Imaging diagnostic methods are extremely important in medicine today. One such imaging diagnostic method is magnetic resonance tomography (MRT), for example, also referred to as nuclear spin tomography or magnetic resonance imaging (MRI). Sectional images of a human body or animal body can be generated using such systems, thereby allowing organs to be assessed and pathological change in an organ to be diagnosed if applicable.

Magnetic resonance tomography systems have a high degree of complexity. For example, a field generation unit (FGU) is required for the purpose of generating and evaluating the magnetic fields. This field generation unit is very expensive, and requires a relatively large amount of space due to the dimensions thereof. Magnetic resonance tomography systems comprising such field generation units are therefore not available in unlimited numbers.

In addition to examinations for obtaining medical evidence from real patients, magnetic resonance tomography systems are also used for educational purposes, e.g. the training and development of operating personnel, or other types of applications. Owing to the high costs and space requirements of magnetic resonance tomography systems, it is therefore necessary in many cases to use the same magnetic resonance tomography system to obtain medical evidence from real patients and for educational purposes or further applications.

SUMMARY

It is therefore desirable, for educational purposes or numerous further applications, to establish a magnetic resonance tomography system which can be realized in an economical and flexible manner and requires the least possible space. In particular, it is desirable to be able to provide a magnetic resonance tomography system which, without an expensive and complex hardware-based field generation unit, can provide the functionalities of a real magnetic resonance tomography system or even extended functionalities if applicable.

The present disclosure proposes a magnetic resonance tomography system and a method for operating a magnetic resonance tomography system having the features as described herein with respect to the various aspects, including the independent claims.

According to a first aspect, provision is made for a magnetic resonance tomography system. The magnetic resonance tomography system comprises at least one control device, a processing device, and an evaluation device. The at least one control device is configured to generate signals for controlling a field generation unit of the magnetic resonance tomography system. The at least one control device is further configured to provide the generated signals for controlling the field generation unit. The processing device is configured to receive the signals for activating the field generation unit from the at least one control device. For instance, using the received signals, the processing device is configured to calculate output signals of the field generation unit and to provide the calculated output signals. The evaluation device is configured to generate image data from the output signals that have been provided by the processing device.

According to a further aspect, provision is made for a method for operating a magnetic resonance tomography system. The method comprises a step for generating signals for activating a field generation unit of the magnetic resonance tomography system. The method further comprises a step for receiving, by means of a processing device, the signals that have been provided for activating the field generation unit and a step for calculating, by means of said processing device, output signals of the field generation unit and outputting these calculated output signals. Furthermore, the method comprises a step for generating image data using the output signals that have been output by the processing device.

The present disclosure is based on the finding that, owing to its complexity and its large dimensions, the field generation unit (FGU) of a magnetic resonance tomography system is usually by far the most expensive component of such a magnetic resonance tomography system. The present disclosure is moreover based on the finding that, except when operating a magnetic resonance tomography system for the purpose of obtaining medical evidence from real patients, standardized measuring scenarios can be advantageous in many cases.

In consideration of this, a concept of the present disclosure is to employ a digital duplicate instead of the hardware-based field generation unit of a magnetic resonance tomography system. It is thus possible to establish a magnetic resonance tomography system that allows user inputs and outputs that are identical to the corresponding inputs and outputs of a system comprising a hardware-based field generation unit. A user can therefore operate such a system in the same way for practicing or educational purposes, and receives the same outputs as would be received from a magnetic resonance tomography system comprising a real field generation unit.

A field generation unit (FGU) can be considered as the totality of the components that are provided for generating the magnetic fields and/or for receiving and processing the magnetic fields. The field generation unit can comprise, for example, a main magnetic coil in the form of a superconducting coil, for example, for generating a main magnetic field. If applicable, the components for cooling this superconducting coil can also form part of the field generation unit accordingly. By means of this coil, a main magnetic field can be induced along a tube axis in the tube itself.

The field generation unit can also comprise three mutually independent gradient coils in X, Y, or Z directions. These gradient coils are important for spatial encoding. The field generation unit can also comprise a transmitting coil, which serves as a radio frequency transmitter for the radio frequency waves that are required for the purpose of imaging. A receiving coil can also be provided in the field generation unit, serving as a sensitive radio frequency receiver.

In addition to the cited coils, the field generation unit can also comprise further components which can be used, for example, to activate the coils and/or to evaluate the signals provided by the coils. Said components can comprise, for example, driver stages for providing electric currents to the coils for the purpose of generating the magnetic fields. Furthermore, provision can also be made in the field generation unit for any control components, which may be required in connection with the generation and evaluation of the magnetic fields. It should however be understood that, in addition to the components named explicitly here, the field generation unit can also comprise any desired further components relevant to the generation of magnetic fields and/or the receipt and the processing of the receive signals.

In this case, the interfaces between the conventional components of the magnetic resonance tomography system (such as, for example, the operator console for planning and control and for the display and output of the image data) and the digitally emulated field generation unit, may be implemented in an identical manner to the corresponding interfaces to a real hardware-based field generation unit. In other words, the processing device that emulates the field generation unit as a virtual field generation unit has interfaces that are identical to those of a real hardware-based field generation unit. In this way, the virtual field generation unit can easily be integrated into a magnetic resonance tomography system. A completely identical working environment is provided for a user in this way.

By virtue of such an arrangement, it is also possible, for example, to preserve the function of the remaining real hardware components at the operator console, including activation of the field generation unit, and of the output interface of the field generation unit, including output of the resulting image data. Accordingly, such an arrangement can also check and analyze the relevant remaining hardware components in a test environment without a real hardware-based field generation unit being required for this purpose. A working environment is thereby produced, for example, for the development and testing of magnetic resonance tomography systems, in which a multiplicity of hardware components can be used, operated, and tested without having to rely on an expensive real hardware-based field generation unit.

Furthermore, the virtual field generation unit in accordance with aspects described herein has the advantage that the objects to be examined can also be provided to the virtual field generation unit as virtual data. Accordingly, for the purpose of developing new magnetic resonance tomography systems, such virtual data relating to objects that are to be examined can be provided in a standardized and repeatable format without real specimens being required for this purpose. As explained in greater detail below, for example, metrologically captured sequences can be provided to the processing device for this purpose. Furthermore, virtual, simulated, or modeled examination objects are also possible. Such simulated or modeled data can be used to optimize new types of systems. Furthermore, such data can also be used for training or educational purposes without the need to provide real examination objects. In the medical field in particular, it is therefore possible to represent examinations without the need for real living beings such as humans or animals.

According to an embodiment, the processing device is designed to calculate the output signals of the field generation unit with the aid of a Bloch simulation. Using such a Bloch simulation, the magnetic fields of the field generation unit can be calculated on the basis of the so-called Bloch equation. This Bloch equation describes the temporal development of a spin system in the magnetic field. The magnetic fields in the field generation unit can be emulated very effectively in this way.

According to an embodiment, the magnetic resonance tomography system comprises a modeling device. This modeling device is designed to provide modeling data relating to a virtual specimen for the magnetic resonance tomography system. In this context, the processing device can be designed to generate the output signals of the field generation unit using the modeling data provided by the modeling device. By virtue of such modeling data for a virtual specimen, specimens can be simulated in the magnetic resonance tomography system without the need to physically sample these specimens in reality by means of a hardware-based field generation unit. It is thereby possible to supply the same specimen data more than once in a manner that can be reproduced. Furthermore, such an approach in respect of virtual specimens also makes it possible to generate and provide specimen data, which is not available or only seldom available in reality.

According to an embodiment, the modeling device comprises a storage device. This storage device is configured to store previously-measured or calculated modeling data. In this context, the modeling device can be configured to read out the modeling data that is stored in the storage device and to provide said modeling data to the processing device. It is thereby possible to provide, for example, modeling data relating to specimens that were actually sampled previously, or were generated previously by means of corresponding simulation or modeling. In this context, the data that is stored in the storage device of the modeling device is permanently available, and therefore this modeling data can be supplied to the system as required, in a manner that can be reproduced.

According to an embodiment, the modeling device comprises a computing device. This computing device is configured to calculate modeling data from user inputs and/or previously stored specifications. In this way, the desired modeling data can be automatically generated and provided by the modeling device as required.

According to an embodiment, the modeling data comprises parameters or characteristic properties of an organic body (e.g. human or animal body) and/or an organ thereof. These properties can comprise, for example, tissue properties that are relevant in connection with an examination in a magnetic resonance tomography system. In addition to static properties, it is also possible to specify dynamic properties such as, for example, the flow of a liquid during an examination or the like.

According to an embodiment, the processing device is configured to calculate and provide the output signals of the field generation unit in real time. The processing device can thus emulate a hardware-based field generation unit which, when used operatively, behaves in exactly the same way as the corresponding hardware-based field generation unit. The operating characteristics of such a magnetic resonance tomography system therefore correspond to a corresponding system comprising a real hardware-based field generation unit.

According to an embodiment, the at least one control device is configured to provide the signals for activating the field generation unit at an output interface, which corresponds to an interface to a real field generation unit of a magnetic resonance tomography system. In this context, the processing device can comprise a corresponding input interface. This input interface is configured to receive the signals for activating the field generation unit from the output interface of the at least one control device. The interfaces of the processing device thus correspond to the corresponding interfaces of a hardware-based field generation unit. This means that the virtual field generation unit, which is emulated by the processing device, can easily be integrated into an otherwise conventional magnetic resonance tomography system.

According to an embodiment, the processing device comprises an output interface. This output interface is configured to provide the output signals, calculated by the processing device, in the form of output signals of (e.g. output signals compatible with the operation of) a real (i.e. physical) field generation unit. As a result of this, like the interfaces described above on the input side of the field generation unit, the field generation unit can easily be connected to a conventional system on the output side.

According to an embodiment, the processing device is configured to receive the signals for activating the field generation unit as digital data and/or to output the output signals of the processing device as digital data. By virtue of such coupling of the processing device by means of interfaces, which receive or output the corresponding data in digital form, it is particularly easy to connect the processing device without laborious signal conversion.

According to an embodiment, the processing device is configured to receive the signals for activating the field generation unit in the form of electrical and/or optical signals and/or to output the output signals of the processing device in the form of electrical and/or optical signals. Electrical signals can be received or output by means of corresponding interfaces in this context. For example, analog-to-digital converters or digital-to-analog converters can be provided to receive or output analog input or output signals, respectively.

Where applicable, the embodiments and developments described above can be combined as desired. Further embodiments, developments, and implementations of the disclosure also include combinations not explicitly cited of features of the disclosure that are described above or below in relation to the exemplary embodiments. A person skilled in the art may add individual aspects to the respective basic forms of the disclosure as improvements or supplements

BRIEF DESCRIPTION OF THE DRAWINGS

Further features and advantages of the disclosure are explained in the following with reference to the figures, in which.

DETAILED DESCRIPTION OF THE DISCLOSURE

Figure 1:
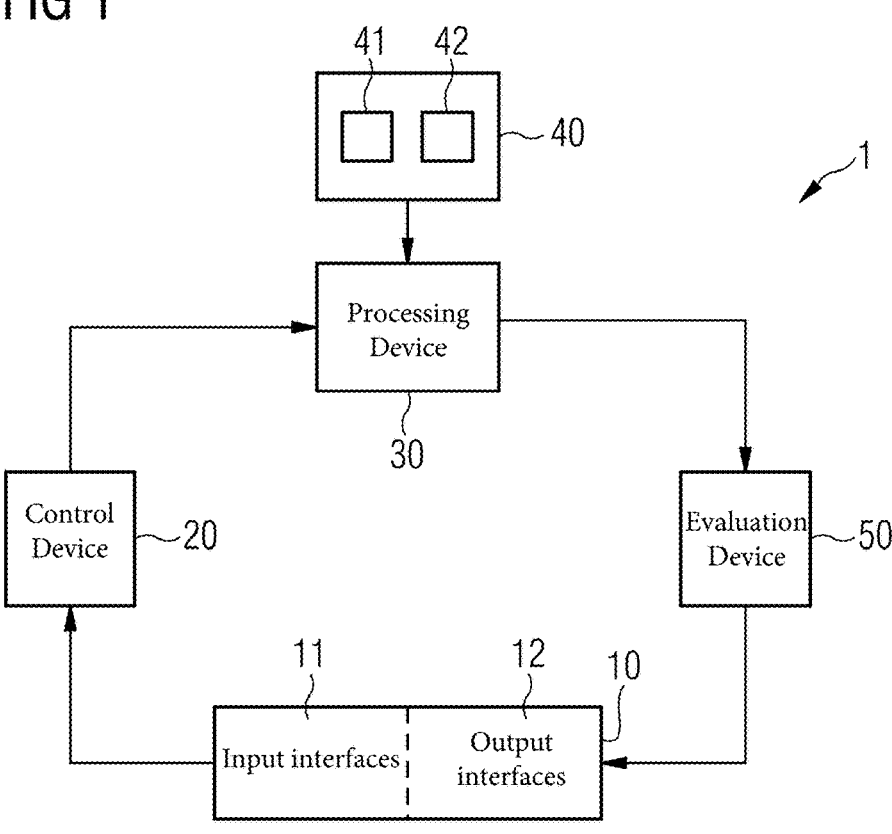
FIG. 1 illustrates an example schematic representation of a block diagram for illustrating a magnetic resonance tomography system according to an embodiment.

FIG. 1 illustrates a schematic representation of an example block diagram of a magnetic resonance tomography system 1 according to an embodiment. The magnetic resonance tomography system 1 can comprise, for example, one or more operator consoles 10. These operator consoles 10 can be used to enter, for example, inputs for planning and performing an examination with the magnetic resonance tomography system 1. For example, one or more separate input interfaces 11 can be provided at an operator console 10 for this purpose. Furthermore, the results of the examination with the magnetic resonance tomography system 1 can also be output at the operator console 10. One or more output interfaces 12 can be provided at the operator console 10 for this purpose. Since the fundamental structure of this operator console 10 does not differ from the structure of a conventional magnetic resonance tomography system 1, no further explanation is given here.

On the basis of the inputs, for example those entered at the operator console 10, it is then possible to activate a field generation unit in a conventional magnetic resonance tomography system. This field generation unit then provides output signals from which image data relating to the examination object can be created and output or displayed at the operator console 10, e.g. at an output section 12.

In the same way, in the magnetic resonance tomography system 1 represented in FIG. 1, activation signals for a field generation unit can also be generated initially by one or more control units 20 on the basis of the user inputs. For this purpose, for example the data relating to a planned examination can be received by the control device (also referred to herein as a controller or controller circuitry) 20. On the basis of this data, it is then possible to generate and output analog and/or digital signals for activating a field generation unit.

The magnetic resonance tomography system 1 according to FIG. 1 differs here from a conventional magnetic resonance tomography system in that, instead of the real hardware-based field generation unit, a processing device 30 for digital emulation of a such a field generation unit is provided. This processing device 30 for digital emulation of a field generation unit can have input and output interfaces, which correspond to the input and output interfaces of a real hardware-based field generation unit. This means that the processing device 30 can easily be integrated into an otherwise conventional magnetic resonance tomography system instead of a hardware-based field generation unit.

The connection between the control device 20 and the processing device 30 can be implemented via digital data connections, for example. Alternatively, it is also possible to exchange electrical and/or optical signals between the control device 20 and the processing device 30. In this case, corresponding components can be provided in the processing device 30 to receive the signals provided by the control device 20 and to convert these received signals into digital data for further processing. For this purpose, analog-to-digital converters or similar can be provided for analog electrical signals, for example.

In the same way, the processing device 30 can provide output signals or output data to an evaluation device (also referred to herein as an evaluator or evaluator circuitry) 50. Here likewise, for example, digital data can be exchanged between the processing device 30 and the evaluation device 50. Additionally or alternatively, the processing device 30 and the evaluation device 50 can exchange optical and/or electrical signals with each other. If, for example, analog electrical signals are to be provided to the evaluation device 50, corresponding components such as, for example, digital-to-analog converters or similar can also be provided in the processing device 30 for this purpose.

The data and/or signals received by the evaluation device 50 can then be processed by the evaluation device 50 to generate image data therefrom. This image data can then be output or displayed at the operator console 10.

In this way, a magnetic resonance tomography system 1 is provided that offers a user the functionality of a realistic, physical magnetic resonance tomography system. Here, it is nonetheless possible to dispense with a real hardware-based field generation unit as a result of using the processing device 30 to emulate a field generation unit.

Such systems, in which a virtual field generation unit in the form of a processing device 30 is provided instead of a real hardware-based field generation unit, are suitable for, e.g. emulating magnetic resonance tomography systems and testing and/or checking the components of such a magnetic resonance tomography system in this way without having to rely on a complex and expensive field generation unit. This means that the components can be tested and checked easily and economically, starting from the operator console, through the modules for activating the field generation unit and for evaluating the output signals from the field generation unit, and on to the output.

Furthermore, such systems comprising a virtual field generation unit in the form of the processing device 30 can also be used for economical training and educational systems or similar, since by far the most expensive component, namely the field generation unit, is not required in this context, it being possible to provide a completely identical and therefore authentic environment for the user.

The operating and system characteristics of the field generation unit that is emulated by the processing device 30 can be calculated using a so-called Bloch simulation, for example. The Bloch equation forming the basis of such a Bloch simulation describes the temporal development of a spin system in the magnetic field. Since the basic form of this underlying Bloch equation is known, a detailed explanation thereof is omitted here.

If applicable, previously stored and metrologically captured data, measurement sequences, or similar, can be used when determining the output signals of the processing device 30. Additionally or alternatively, previously determined modelings or simulation results can be stored in a storage entity of the processing device 30, and this stored data can be used when generating the output signals of the processing device 30.

The processing device 30 can also generate the output signals using data for virtual specimens. For this purpose, such data relating to virtual specimens can be provided to the processing device 30 by a modeling device (also referred to herein as a modeler or modeling circuitry) 40.

For example, data from previously-metrologically analyzed specimens can be stored in a storage entity 41 of the modeling device 40. Additionally or alternatively, it is also possible to store data from previously modeled or simulated specimens in such a storage entity 41 of the modeling device 40, and to provide said data to the processing device 30 in a suitable format when required.

Furthermore, provision can be made in the modeling device 40 for a computing device (also referred to herein as computing circuitry or a computer) 42 that calculates modeling data on the basis of specifications such as, for example, user inputs or similar, as required. By this means, it is easily possible to perform examinations on the basis of virtual specimens. For instance, it is also thereby possible to create virtual specimens without having to rely on measurements from real objects or living beings.

By virtue of the processing device 30 and the virtual specimens that are available in this context, it is thus possible to execute a plurality of scans on an identical virtual specimen. In this context, it is possible to vary the parameterization that has been specified by a user, for example. This means that the user can easily learn about the effects of their chosen parameterization using an identical virtual examination object.

Furthermore, it is also possible by means of the modeling device 40 to generate virtual specimens that do not occur or only occur very seldom in reality. As a result of creating a virtual specimen having data that is provided to the processing device 30 by the modeling device 40, it is therefore also possible to perform and learn about examinations using such data. An emulation of purely theoretical specimens is also possible in this way.

The data for the virtual specimens, as provided by the modeling device 40, can relate not only to purely static specimens but also to virtual specimens having dynamic characteristics. For example, a movement such as the flow of a liquid, for example blood or similar, can also be emulated in the virtual specimens.

In addition to the provision of locally-stored modeling data relating to real or modeled specimens and the local calculation of modeling data, it is moreover possible to receive modeling data from a remote server, for example a cloud or similar, and to provide this to the processing device 30. For example, a corresponding communication interface for exchanging data with a remote server can be provided for this purpose in the modeling device 40.

The receipt of the activation signals and the calculation and output of the output signals by the processing device 30 may take place in real time. In other words, the processing device 30 provides the output signals of a virtual field generation unit with the same timing characteristics as a real hardware-based field generation unit. In this way, both the signal characteristics and the timing characteristics of a real system can be emulated identically. Such a system is therefore experienced by a user in the same way as a real system comprising a field generation unit, which is implemented in hardware.

Figure 2:
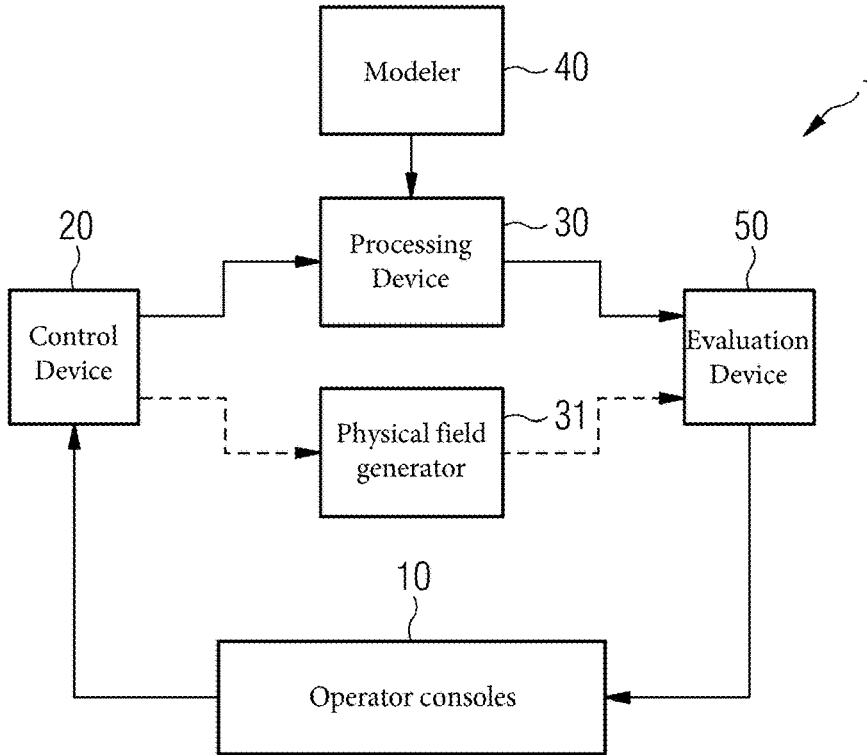
FIG. 2 illustrates an example schematic representation of a block diagram for illustrating a magnetic resonance tomography system according to a further embodiment.

FIG. 2 shows an example schematic representation of a block diagram of a magnetic resonance tomography system 1 according to a further embodiment. The magnetic resonance tomography system 1 according to this embodiment differs from the exemplary embodiment described above in that both a hardware-based field generation unit (also referred to herein as a field generator or a physical field generator) 31 and a processing device (also referred to herein as a processor or processing circuitry, or a virtual or emulated field generator) 30 for emulating a virtual field generation unit are provided. Accordingly, it is possible to switch between the hardware-based field generation unit 31 and the processing device 30 in an otherwise identical system structure. This means that such a system can be used to examine real (e.g. organic) specimens by means of the hardware-based field generation unit 31, for example.

Alternatively, it is possible to switch to the processing device 30 instead of the hardware-based field generation unit 31. This allows virtual specimens to be supplied by the modeling device 40, for example.

A user at their customary workstation can therefore learn about or undergo training on the system characteristics by using the processing device 30 and making use of virtual specimens, and can optionally also plan future examinations on the basis of the virtual specimens. For example, various measurement sequences can initially be tested on the basis of virtual specimens here, before an examination takes place on a real object, e.g. a living being.

In addition to the above, any desired further applications that make use of the processing device 30 as a virtual field generation unit are also possible. Likewise, the virtual specimens can also be used for any desired applications.

Any suitable approach can be chosen for the creation of virtual specimens by the modeling device 40. As explained above, data that was captured metrologically, for example, can be used as a basis. Likewise, data from previously-executed simulations or modeling for virtual models, for example, can be used. Furthermore, any suitable combinations comprising previously-determined measured values and calculated modelings are possible.

For instance, predetermined properties for a specimen can also be specified by a user, for example. On the basis of these specifications, the modeling device 40 can then create a corresponding modeling of a virtual specimen, and provide the corresponding data to the processing device 30.

It is also possible for a user to create a model in advance, manually, automatically, or semi-automatically, for a specimen that is to be analyzed, and to provide this model data to the modeling device 40. This means that particular user-specific and individual virtual specimens can also be processed by the resonance tomography system 1.

Figure 3:
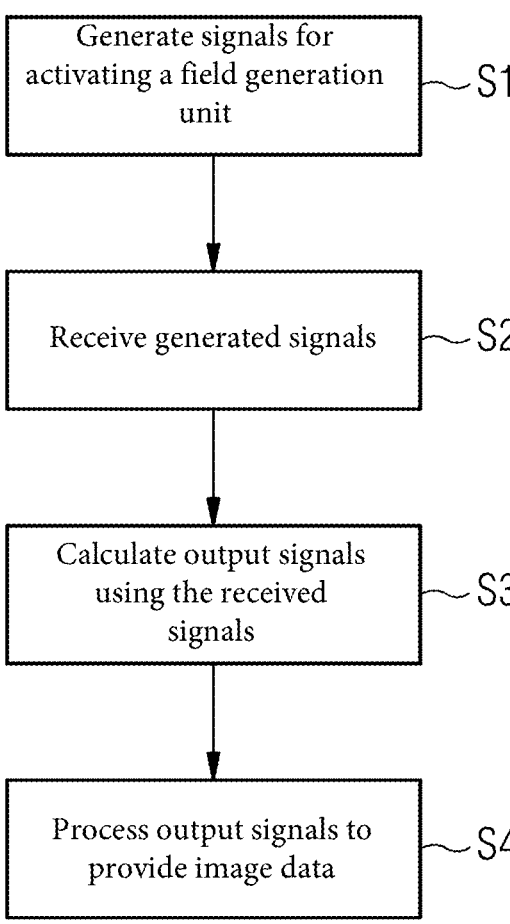
FIG. 3 illustrates an example flow diagram for operating a magnetic resonance tomography system according to an embodiment.

FIG. 3 shows an example flow diagram such as forms the basis of a method for operating an embodiment of a magnetic resonance tomography system 1. The method may comprise any suitable number of method steps required for the realization of the magnetic resonance tomography system 1 described above. Similarly, the magnetic resonance tomography system 1 described above can comprise any number of components required for the implementation of the method described below.

In a provision step S1, signals for activating a field generation unit of a magnetic resonance tomography system are generated by one or more control devices 20, and the generated signals are then provided.

In a processing step S2, generated signals are received by a processing device 30. In a further step S3, output signals of a field generation unit are then calculated using the received signals. The calculated output signals can be provided to an evaluation device 50.

In an evaluation step S4, the output signals provided by the processing device 30 are finally processed and image data is generated therefrom. The image data can be displayed to a user or output in any other way.

For the purpose of processing the activation signals in the processing device 30, model data from virtual specimens can also be provided to the processing device 30. This model data can be based on real data that was captured previously by metrological means, for example. Additionally or alternatively, modeling or simulation results for modeling virtual specimens can also be provided to the processing device 30.

In summary, the present disclosure relates to a magnetic resonance tomography system in which the field generation unit (FGU) can be replaced by a digital emulation. Activation signals of a conventional system can be provided to this digital emulation. The digital emulation of the field generation unit outputs output signals that correspond to output signals of a hardware-based field generation unit.

The various components described herein may be referred to as "units" or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units or devices, as applicable and relevant, may alternatively be referred to herein as "circuitry," "controllers," "processors," or "processing circuitry," or alternatively as noted herein.

What is claimed is:

1. A magnetic resonance imaging system, comprising:
a physical field generator;
processing circuitry;
a controller configured to generate activation signals for activating the physical field generator, and to selectively provide the generated activation signals to one of the physical field generator or the processing circuitry,
    wherein, when the generated activation signals are provided to the processing circuitry, the processing circuitry is configured to receive the activation signals and to use the activation signals to generate calculated output signals that simulate output signals of the physical field generator,
    wherein, when the generated activation signals are provided to the physical field generator, the physical field generator is configured to receive the generated activation signals and to use the generated activation signals to generate physical output signals; and
evaluator circuitry configured to generate image data using (i) the calculated output signals or (ii) the physical output signals.

2. The magnetic resonance imaging system as claimed in claim 1, wherein, when the generated activation signals are provided to the processing circuitry, the processing circuitry is configured to generate the calculated output signals using a Bloch simulation.

3. The magnetic resonance imaging system as claimed in claim 1, further comprising:
modeling circuitry configured to provide modeling data relating to a virtual specimen for the magnetic resonance imaging system,
wherein, when the generated activation signals are provided to the processing circuitry, the processing circuitry is configured to generate the calculated output signals using the modeling data.

4. The magnetic resonance imaging system as claimed in claim 3, further comprising:
a storage device configured to store previously-measured or calculated modeling data,
wherein the modeling circuitry is configured to read out the modeling data that is stored in the storage device and, when the generated activation signals are provided to the processing circuitry, to provide the modeling data to the processing circuitry.

5. The magnetic resonance imaging system as claimed in claim 3, further comprising:
a computing device configured to calculate the modeling data using user inputs and/or previously-stored specifications.

6. The magnetic resonance imaging system as claimed in claim 3, wherein the modeling data comprises parameters or characteristic properties of an organic body or an organ thereof.

7. The magnetic resonance imaging system as claimed in claim 1, wherein, when the generated activation signals are provided to the processing circuitry, the processing circuitry is configured to generate the calculated output signals in real time.

8. The magnetic resonance imaging system as claimed in claim 1, wherein, when the generated activation signals are provided to the processing circuitry, the processing circuitry is configured to receive the generated activation signals for as digital data.

9. The magnetic resonance imaging system as claimed in claim 1, wherein, when the generated activation signals are provided to the processing circuitry, the processing circuitry is configured to generate the calculated output signals as digital data.

10. The magnetic resonance imaging system as claimed in claim 1, wherein the generated activation signals comprise electrical and/or optical signals.

11. The magnetic resonance imaging system as claimed in claim 1, wherein, when the generated activation signals are provided to the processing circuitry, the processing circuitry is configured to generate the calculated output signals as electrical and/or optical signals.

12. A method for operating a magnetic resonance imaging system including a physical field generator and processing circuitry, the method comprising:

generating activation signals for activating the physical field generator;

selectively providing the generated activation signals to one of the physical field generator or the processing circuitry;

when the generated activation signals are provided to the processing circuitry:

receiving, via processing circuitry, the generated activation signals;

generating, via the processing circuitry, calculated output signals that simulate output signals of the physical field generator; and outputting the generated calculated output signals; and when the generated activation signals are provided to the physical field generator:

receiving the generated activation signals and using the generated activation signals to generate physical output signals; and generating image data using (i) the calculated output signals or (ii) the physical output signals.

13. The method as claimed in claim 12, wherein the generating the calculated output signals comprises using model data relating to a virtual specimen.

* * * * *